United States Patent

Chen et al.

[11] Patent Number: 6,120,844
[45] Date of Patent: Sep. 19, 2000

[54] DEPOSITION FILM ORIENTATION AND REFLECTIVITY IMPROVEMENT USING A SELF-ALIGNING ULTRA-THIN LAYER

[75] Inventors: Liang Chen, San Jose; Ted Guo, Palo Alto; Fusen Chen, Cupertino; Roderick C. Mosely, Pleasanton, all of Calif.

[73] Assignee: Applied Materials, Inc., Santa Clara, Calif.

[21] Appl. No.: 08/622,941

[22] Filed: Mar. 27, 1996

Related U.S. Application Data

[63] Continuation-in-part of application No. 08/611,108, Mar. 5, 1996, which is a continuation-in-part of application No. 08/561,605, Nov. 21, 1995, Pat. No. 5,877,087.

[51] Int. Cl.[7] .......................... C23C 14/34; C23C 16/06; C23C 16/22

[52] U.S. Cl. .................... 427/255.28; 427/255.34; 427/255.36; 427/255.391; 427/255.7; 427/99; 204/192.1; 204/192.27

[58] Field of Search .................. 427/99, 96, 255, 427/255.7, 255.28, 255.34, 255.36, 255.391; 204/192.1, 192.25, 192.27; 438/660, 669, 675, 680

[56] References Cited

U.S. PATENT DOCUMENTS

| | | | |
|---|---|---|---|
| 4,897,287 | 1/1990 | Berger et al. | 427/255.2 |
| 4,923,717 | 5/1990 | Gladfelter et al. | 427/252 |
| 4,960,732 | 10/1990 | Dixit et al. . | |
| 5,232,872 | 8/1993 | Ohba | 438/685 |
| 5,250,467 | 10/1993 | Somekh et al. . | |
| 5,308,796 | 5/1994 | Feldman et al. . | |
| 5,345,108 | 9/1994 | Kikkawa | 257/750 |
| 5,429,991 | 7/1995 | Iwasaki et al. . | |
| 5,514,425 | 5/1996 | Ito et al. . | |
| 5,567,987 | 10/1996 | Lee | 257/762 |

FOREIGN PATENT DOCUMENTS

| | | |
|---|---|---|
| 8-10693 | 1/1986 | Japan . |
| 2513900 | 4/1996 | Japan . |

*Primary Examiner*—Shrive Beck
*Assistant Examiner*—Bret Chen
*Attorney, Agent, or Firm*—Thomason Moser & Patterson

[57] ABSTRACT

The present invention relates generally to an improved apparatus and process to provide a thin self-aligning layer prior to forming a conducting film layer thereover to improve the film characteristics and deposition coverage. In one aspect of the invention, a dielectric layer is formed over a conducting or semiconducting layer and etched to form an aperture exposing the underlying conducting or semiconducting layer on the aperture floor. An ultra-thin nucleation layer is then deposited by either vapor deposition or chemical vapor deposition onto the field of the dielectric layer. A CVD metal layer is then deposited onto the structure to achieve selective deposition on the floor of the aperture, while preferably also forming a highly oriented blanket layer on the field. In another aspect of the invention, a thin, self-aligning layer is formed over a barrier layer prior to deposition of a conducting film thereover. It is believed that the self-aligning layer enhances the reflectivity of the films by improving the crystal structure in the resulting film and provides improved electromigration performance by providing <111> crystal orientation. The process is preferably carried out in an integrated processing system that includes both a PVD and CVD processing chamber so that once the substrate is introduced into a vacuum environment, the process occurs without the formation of oxides between the layers.

18 Claims, 5 Drawing Sheets

BASE LINE PROCESS WITH PVD TiN:

| PROCESS SEQUENCE | REFLECTIVITY (% @ 436 NM) |
|---|---|
| Ti/PVD-TiN/ANNEAL/Ti/HOT Al (520C) | ~170% |

BASE LINE PROCESS WITH CVD TiN:

| PROCESS SEQUENCE | REFLECTIVITY (% @ 436 NM) |
|---|---|
| Ti/CVD-TiN/ANNEAL/Ti/HOT Al (520C) | ~140% |

PROCESS WITH CVD TiN USING PRIME:

| PROCESS SEQUENCE | REFLECTIVITY (% @ 436 NM) |
|---|---|
| Ti/CVD-TiN/ANNEAL/ε – PVD-TiN/Ti/ HOT Al (520C) | ~170% |

FIG. 2

DEPOSITION FILM ORIENTATION AND REFLECTIVITY IMPROVEMENT USING A SELF-ALIGNING ULTRA-THIN LAYER

BACKGROUND OF THE INVENTION

This is a continuation-in-part application of U.S. patent application Ser. No. 08/611,108, filed on Mar. 5, 1996, entitled "Blanket-Selective Deposition Using a Self-Aligning Ultra-Thin Nucleation Layer," which application is a continuation-in-part application of pending U.S. patent application Ser. No. 08/561,605, filed on Nov. 21, 1995, entitled "Low Temperature Integrated Metallization Process and Apparatus", now U.S. Pat. No. 5,877,087.

FIELD OF THE INVENTION

The present invention relates to a method and apparatus for manufacturing integrated circuits on semiconductor substrates. More particularly, the present invention relates to the deposition of ultra-thin self-aligning nucleation layers on a substrate and subsequently depositing a conducting layer thereon resulting in a highly oriented crystal structure formed within this subsequent layer having improved electromigration performance. In another aspect of the invention, a method and apparatus is provided for the selective metallization of apertures formed on substrates in the fabrication of integrated circuits to form void-free interconnects between conducting layers, including apertures such as contacts or vias in high aspect ratio sub-half micron applications, while preferably also forming a highly oriented blanket layer on the field.

BACKGROUND OF THE RELATED ART

Sub-half micron multilevel metallization is one of the key technologies for the next generation of very large scale integration ("VLSI"). The multilevel interconnections that lie at the heart of this technology require planarization of interconnect features formed in high aspect ratio apertures, including contacts, vias, lines or other features. Reliable formation of these interconnect features is very important to the success of VLSI and to the continued effort to increase circuit density and quality on individual substrates and die.

One means for increasing circuit density is to decrease the dimensions of the metal conductors that make up the integrated circuit. As the dimensions are made smaller, the operating speed increases and the power density remains constant, but the current density is increased in proportion to the scale-down factor. Metal conductors have an upper current density limit imposed by electromigration. Electromigration is a diffusive process in which the atoms of a solid move from one place to another under the influence of electrical forces. This effect limits the maximum current that can be carried by a conductor without its rapid destruction. For example, the current density for aluminum conductors of integrated circuits must be kept lower than $10^6$ A/cm$^2$. Electromigration does not limit the minimum device size but, rather, limits the number of circuit functions that can be carried out by a given number of connected circuit elements per unit time. Highly oriented crystalline growth of the conducting layers have enhanced electromigration resistance. Therefore, as geometries of integrated circuits are reduced, the need for highly oriented films increases. Ideally, a film layer having a <111> crystal orientation is formed on the substrate to improve the electromigration properties of the film at these small geometries.

Two conventional methods for depositing film layers is by chemical vapor deposition ("CVD") and physical vapor deposition ("PVD"). CVD processes typically include a blanket process and a selective process wherein the deposition of a film layer occurs when a component of the chemical vapor contacts a "nucleation site" on the substrate. The component attaches to the nucleation site, creating a deposit surface on which further deposition proceeds. In a blanket CVD process, all surfaces serve as nucleation surfaces, and the vapor will deposit a film on the entire exposed surface of the substrate, including the side and bottom surfaces of an aperture as well as the field. A selective process typically deposits a film only on select nucleation sites provided on the substrate, typically at the base of apertures.

Thin films deposited during a blanket CVD process are usually conformal and provide excellent step coverage, i.e., uniform thickness of layers on the sides and base of any aperture formed on the substrate, even for very small aperture geometries. Therefore, blanket CVD is a common method used to fill apertures. However, there are two primary difficulties associated with blanket CVD processes. First, blanket CVD films grow from all sides in an aperture which typically results in a void in the filled aperture because the deposited layer grows upwardly and outwardly at the upper corners of the aperture and bridges at the upper surface of the aperture before the aperture has been completely filled (i.e., "crowning"). Also, a nucleation layer, i.e., a continuous film layer to insure nucleation over all surfaces of the substrate, which must be deposited on the aperture walls to ensure deposition of the CVD layer thereon, further reduces the width of the aperture, thereby increasing the difficulty of void-free filling of the aperture without voids. Second, films deposited by blanket CVD tend to conform to the topography of the surface on which the films are deposited which may result in a film having a randomly oriented crystal structure and resulting lower reflectivity properties and poor electromigration performance if the topography is non-oriented or random.

Selective CVD is based on the fact that the decomposition of the CVD precursor gas to provide a deposition film usually requires a source of electrons from a conductive nucleation film. In accordance with a conventional selective CVD process, deposition should occur in the bottom of an aperture where either a conducting film or doped silicon from the underlying layer has been exposed, but should not grow on the insulative field or insulative aperture walls where no nucleation sites are provided. These conducting films and/or doped silicon exposed at the base of the apertures, unlike dielectric surfaces, supply the electrons needed for decomposition of the precursor gas and resulting deposition of the film layer. The result obtained through selective deposition is a "bottom-up" growth of the film in the apertures capable of filling very small dimension (<0.25 μm), high aspect ratio (>5:1) vias or contacts. However, in selective CVD processes unwanted nodules form on the field where defects in that surface exist.

PVD processes, on the other hand, enable deposition of highly oriented films having improved reflectivity, but do not provide good aperture filling or step coverage in high aspect ratio applications. Physical sputtering of target material results in particles traveling at acute angles relative to the substrate surface. As a result, where high aspect ratio apertures are being filled, sputtered particles tend to deposit on the upper wall surfaces and cover the opening thereof before the aperture is completely filled with deposition material. The resulting structure typically includes voids therein which compromise the integrity of the devices formed on the substrate.

High aspect ratio apertures can be filled using PVD processes by depositing the film at elevated temperatures. As an example, aluminum can be deposited at 400° C. or higher to enhance flow of the aluminum on the surface and throughout the aperture. It has been found that this hot Al process provides improved step coverage. However, a film deposited using a hot Al process has been shown to have poor reflectivity. High reflectivity is an important characteristic in films because it is an indication of a highly oriented crystal structure which means better electromigration performance and enables better definition of lines in a photolithographic processes which are used to pattern the layers formed on the substrate during integrated circuits fabrication.

Therefore, there is a need for a metallization process for void-free filling of apertures, particularly high aspect ratio, sub-quarter micron applications which reduces the problems of nodule formation on the field and provides uniform growth of a film layer on the field while the aperture is being filled. More particularly, it would be desirable to have a process to accomplish selective deposition within high aspect ratio sub-quarter micron apertures and simultaneous blanket deposition of a highly oriented (i.e., <111>) film on the field, particularly if the process formed highly oriented films at a controllable rate. There is also a need to provide enhanced reflectivity of metal films deposited by PVD or CVD techniques over barrier or liner layers. It would be advantageous to find a single process which can be used in one application to eliminate nodule formation and improve selectivity and in another application to provide films with improved reflectivity.

SUMMARY OF THE INVENTION

The present invention provides a method and apparatus for depositing a small quantity of self-aligning material on a substrate to prevent nodule formation on the field while selectively filling high aspect ratio apertures on a substrate or to enhance reflectivity of a subsequent film. Preferably, the small quantity of self-aligning material is selected from the group consisting of titanium, titanium nitride, aluminum, Nb, aluminum silicates, silica, high alumina, Si, Cu, Ta, or a combination thereof and is deposited in an amount from about a few scattered atoms up to a layer of about 100 Å.

In one aspect of the invention, a method and apparatus is provided for preventing nodule formation on a dielectric surface by selectively forming a film layer within an aperture and depositing a blanket on the field of a substrate. The process includes first depositing a small quantity of self-aligning material to form a plurality of self-aligning nucleation sites on the field of a patterned substrate on which the film is to be grown and then depositing the conducting film layer thereover. Preferably, the self-aligning nucleation sites are formed by depositing an ultra thin nucleation layer to provide a density of nucleation sites to control the rate at which the film is grown on the field so that the opening of the aperture is not bridged before the aperture is completely filled.

In another aspect of the present invention, a method and apparatus is provided for improving the reflectivity of a film layer formed over a barrier or liner layer by first depositing a small quantity of the self-aligning material over the barrier or liner layer and then depositing the desired highly reflective film thereover using either a PVD or CVD process.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIG. 2 is a chart showing the comparison of the reflectivities of various layers formed by different processes, including a layer formed in accordance with one aspect of the present invention;

DETAILED DESCRIPTION OF A PREFERRED EMBODIMENT

Figure 1:
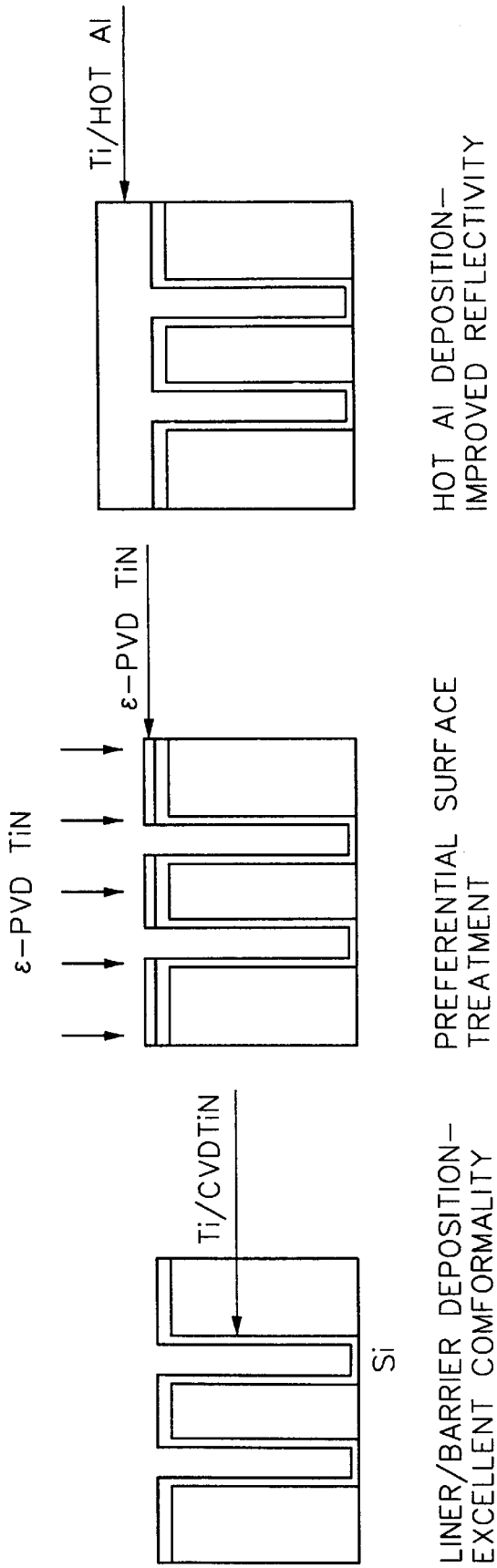
FIG. 1 is a cross-sectional view of a substrate showing the deposition of various layers thereon in accordance with one aspect of the present invention.

The present invention provides a method and apparatus for obtaining film layers with highly oriented crystal structures having improved reflectivity, wherein the ultimate layer is formed by either CVD or PVD techniques. In one aspect the present invention, a process and apparatus is provided for the selective deposition of material within small geometries, such as high aspect ratio apertures, to selectively form void-free structures such as interconnects in the apertures while also forming a highly oriented film layer on the field using CVD techniques. In another aspect of the invention, a highly oriented film is formed over a barrier or liner layer by first depositing a small quantity of self-aligning material, such as on the surface of the substrate and then depositing the highly oriented film layer thereon by either PVD or CVD techniques. The various deposition steps performed on the substrate may include a combination of PVD and CVD processes which can be carried out on an integrated cluster tool.

In the blanket-selective CVD application of the invention, a small quantity of self-aligning material forms nucleation sites on the field which, when exposed to the chemical vapor in a CVD process, initiate film growth over the field while simultaneously filling any apertures formed in the substrate from the bottom up without bridging the opening of the aperture. Preferably, this is enabled by growing a film layer on the field at a rate at least slightly less than that in the aperture until the aperture is filled to prevent a continuous film layer formed on the field from prematurely bridging the opening of the aperture. A nucleation density on the field of the substrate is thereby provided which facilitates growth of a highly oriented film on the field having a <111> orientation for better electromigration performance and controls the rate at which a blanket layer is grown on the field. To provide an overlying film layer having high uniformity and high reflectivity, the refractory material may be deposited over a conformal CVD layer and the ultimate layer is formed thereover by PVD or CVD techniques. Where aperture filling by CVD without void formation is desired, the small quantity of self-aligning material is deposited over the material having the aperture therethrough, and a CVD layer is deposited there over.

In the blanket-selective CVD application, the film grown on the nucleated surface forms islands of highly oriented crystals which join together and grow to form a uniform film layer. It is believed that each of the nucleation sites will facilitate the crystallization of the conducting layer into a single grain, and will determine the rate at which a film is grown on the field. The self-aligning nucleation layer provides fewer nucleation sites than are typically present on a blanket layer of nucleation material, therefore, fewer grains of the CVD film layer are subsequently formed and the uniformity of the crystal structure of the conducting layer is increased. Preferably, fewer nucleation sites are provided on the field, thereby allowing a higher deposition rate within the apertures relative to the deposition rate on the field so that the deposition rate within the aperture is greater than the rate at which a film forms on the field, until the entire surface, or substantially the entire surface, of the substrate is covered with the material being deposited on the nucleation sites. The amount of material deposited as the thin epsilon layer determines the rate at which the film grows on the field. It should be recognized that as the distance between nucleation sites is increased, the overall deposition rate on the field or other surface on which the nucleation sites are deposited will decrease. Likewise, if the density is increased, too many sites may be present, and the film layer growing thereon may grow too fast and bridge the aperture before it is filled. Therefore, a balance between the number of sites, crystal orientation and deposition rate must be reached for a given application and aperture geometry so that the overall deposition rate is not adversely affected.

In the preferential reflectivity improvement on the field (PRIME) application, the epsilon material is deposited over a barrier or liner layer, typically comprising Ti, TiN, or a combination of Ti and TiN, and a metal or conducting layer is formed thereover. The reflectivity of the film formed over the epsilon layer is improved. The epsilon layer may be formed of a single material or it may be formed of a combination of materials selected from the group consisting of titanium, titanium nitride, aluminum, Nb, aluminum silicates, silica, high alumina, Si, Cu, Ta.

Referring to FIG. 1, an embodiment of the invention providing a highly uniform and highly reflective layer by PVD or CVD using the PRIME process is shown. The inventors have discovered that depositing the small quantity of self-aligning material before depositing a conducting film thereover will improve the reflectivity of that film by facilitating the growth of a highly oriented crystal structure within the film. FIG. 1 depicts one example where a Ti/CVD-TiN barrier or liner layer is formed on a patterned substrate, preferably having a thickness of about 400 Å and about 200 Å, respectively. A thin, self-aligning epsilon TiN layer, preferably less than about 50 Å thick, is then deposited on the field using PVD techniques to provide a surface on which a Ti and hot Al layer can then be deposited. The Ti and Al layers are deposited at thicknesses of about 400 Å and about 5000 Å, respectively. The thin, self-aligning epsilon TiN layer is preferably deposited by sputtering a target of refractory material in a nitrogen rich atmosphere to provide a flux of TiN, a portion of which will deposit on the substrate. The hot Al layer deposited over the epsilon layer has improved reflectivity over a hot Al layer deposited directly on the Ti/CVD-TiN barrier or liner layer without an epsilon layer of the present invention as shown in FIG. 2.

It has been found that the deposition of a thin self-aligning epsilon layer enhances the crystal orientation as well as provides a large crystal structure of the resulting film. In addition to a single Ti/TiN nucleation layer, it has further been found by the inventors that a combination of a Ti/TiN, Ti/Al layer, TiN/Al layer or any combination thereof may be deposited as the epsilon layer on the substrate to promote large crystal formation and <111> crystal orientation in the deposited film. Improving the crystal structure of the resulting film enhances the electrical properties and reduces stress within the film. It is believed by the inventors that the orientation may be improved by subsequently depositing an epsilon layer of PVD Al over the epsilon Ti or TiN layer so that the TiN or Ti layer cannot chemically bind to other reactive species within the chamber, e.g., carbon.

FIG. 2 compares the reflectivities of hot Al formed on 1) PVD TiN, 2) CVD TiN, and 3) CVD TiN with an epsilon film according to the present invention formed thereon. FIG. 2 illustrates that the reflectivity of the hot Al layer deposited on the thin self-aligning refractory layer shows a thirty percent (30%) increase in reflectivity over the film formed on the Ti/CVD-TiN layer without the epsilon layer. The reflectivity of the film was measured at 436 μm with a silicon baseline.

In the blanket-selective and the PRIME applications, the thin self-aligning epsilon film may comprise a single atomic layer or monolayer of a single material or it may comprise atomic layers or monolayers of multiple materials deposited in sequence. It is most preferred that the material be dispersed, preferably generally uniformly on a gross scale, over the substrate surface to enhance film formation thereon.

The self-aligning nucleation material will typically be a conductive material, such as a metal, capable of providing an electron to a conducting precursor (such as a CVD metal) to facilitate the reaction thereof and crystallization of a deposited conducting film layer. The preferred nucleation layer is comprised of conductive materials such as titanium (Ti), aluminum (Al), titanium nitride (TiN), copper (Cu) and silicon (Si).

In another aspect of the invention, a method is provided comprising a first step of physical vapor depositing an ultra-thin self-aligning layer of a conductive material onto a precleaned substrate to serve as a nucleation layer over the field having an aperture with an electrically conducting floor formed therein. It is preferred that the self-aligning nucleation layer comprise individual atoms of the nucleation material dispersed substantially evenly over the field, or a uniform film layer having a lower affinity for nucleating CVD deposition than the material exposed at the base of the aperture. The small geometries of the apertures formed on the substrate generally preclude nucleation material from depositing on the walls of the aperture, however, deposition on the walls of the aperture can be reduced with the use of a collimator to intercept particles traveling at trajectories oblique to the surface of the substrate. It is believe that the ultra-tin nucleation layer provides self-aligning nucleation sites which result in a highly oriented crystal structure in a subsequently deposited material. The conducting layer is believed to reach its lowest energy state as it deposits on the nucleation layer, thus resulting in a highly oriented crystal structure.

In a second step of the process, a conducting film is deposited by either a CVD or PVD process over the structure to provide selective growth of the metal on the electrically conducting floor of the aperture with simultaneous uniform growth of a highly oriented film on the field. The deposition rate within the aperture is preferably higher than the rate on the field so that the film deposited on the field completely covers the surface as the aperture is filled or shortly thereafter. Accordingly, the present invention provides a method and apparatus for void-free filling of small geometries with a reduced number of processing steps while forming a highly oriented film on the field.

Figure 3:
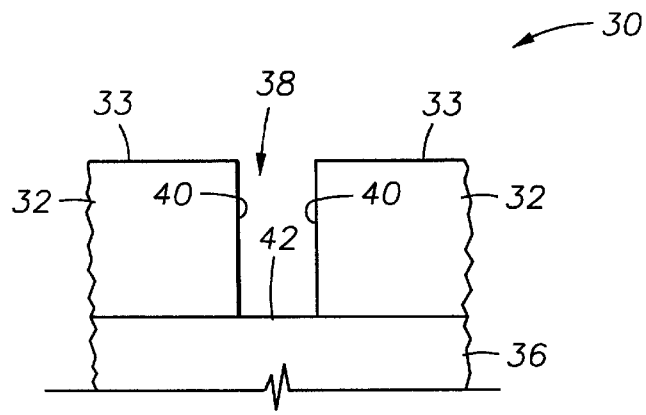
FIG. 3 is a cross-sectional diagram of a substrate having a field and high aspect ratio aperture formed in a dielectric layer.

Referring to FIG. 3, a cross-sectional diagram of a layered structure 30 is shown including a layer 32, such as a dielectric layer, formed over an electrically conducting member or layer 36. The electrically conducting member 36 may take the form of a doped silicon substrate or it may be a first or subsequent conducting layer formed on a substrate. The electrically conducting member 36 will typically have been previously patterned to form part of an electronic device. The layer 32 is formed over the conducting member 36 in accordance with CVD or PVD processes known in the art to form a part of the overall integrated circuit.

The layer 32 is then patterned and etched to open aperture 38 for forming vias or contacts down to a conducting or semiconducting layer 36. The patterning and etching of the aperture 38 may be accomplished with any conventional method known to one of ordinary skill in the art. The aperture 38 has walls 40 formed in the layer 32 that extend downward a sufficient distance to expose a surface or floor 42 of the conducting member or layer 36.

Figure 4:
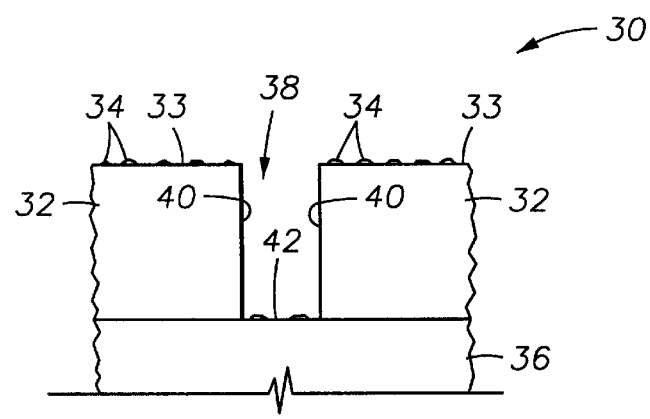
FIG. 4 is a cross-sectional diagram of a physical vapor deposited sub-monolayer of a nucleation material formed on the substrate of FIG. 3.

Referring to FIG. 4, a cross-sectional diagram of an ultra-thin, nucleation layer 34 of a nucleation material formed by PVD on the layer 32 is shown. The nucleation layer facilitates the process by which the subsequently deposited conducting layer begins to form a solid crystalline state of matter comprising a definite arrangement of atoms, ions or molecules on the substrate.

The preferred self-aligning nucleation layer 34 includes such layers as a Ti layer formed by physical vapor deposition (PVD Ti), a conducting layer such as a metal (Al) or other refractory (Nb, Ta, aluminum silicates, silica, high alumina, etc.), TiN formed by PVD (PVD TiN), or a combination of these layers. Titanium is a preferred nucleation material because titanium provides good nucleation of aluminum, has good wetting properties with aluminum, has a melting temperature of about 1675° C. and may be deposited by PVD or CVD processes. It is preferred that the ultra-thin nucleation layer consist of a sub-monolayer of atoms deposited by physical vapor deposition, but may be on the order of about 50 Å. As an example, an ultra-thin nucleation layer may be formed by sputtering a twelve (12) inch Ti target at 20–200 watts onto a six (6) inch substrate positioned about two (2) inches from the target. Preferably, the target is sputtered for about 72 ws to provide what the inventors believe to be a self-aligning, sub-monolayer of Ti atoms. In another aspect of the invention Ti or TiN may form a first ultra-thin layer and Al may form a second ultra-thin layer to further enhance crystal size and orientation of the resulting film.

The self-aligning nucleation layer 34 consists of atomic particles dispersed more or less evenly over the field of layer 32 to nucleate deposition of a subsequently deposited conducting layer such as Al in a CVD process and to align the crystals of the conducting layer in both CVD and PVD applications for depositing a conducting layer on the ultra-thin self-aligning layer. In this manner, the presence of the nucleation layer 34 provides nucleation sites for highly oriented and uniform growth of a conducting layer on the field. If defects exist on the field 33 of the layer 32 and cause deposition of metal thereon, the rate of metal deposition on the defects (which previously formed undesirable nodules) will typically be no greater than that of the uniform growth initiated at the nucleation sites and a uniform, highly oriented conducting layer is grown regardless of defects in the layer 32. Consequently, this process eliminates the need to polish the surface of layer 32 following selective deposition in the aperture to remove any nodules which may have formed on the field.

Figure 5:
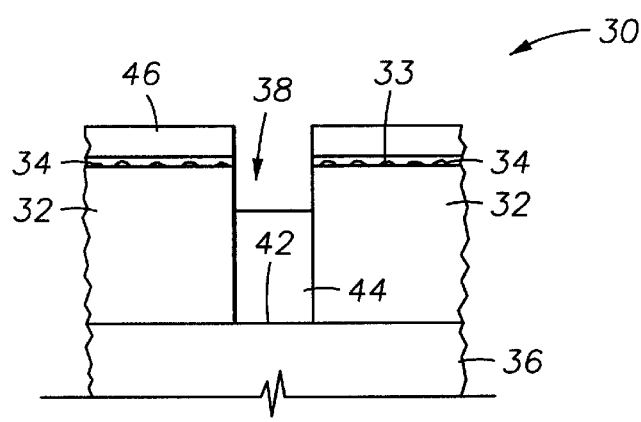
FIG. 5 is a cross-sectional diagram of a chemical vapor deposition aluminum layer being selectively deposited in the aperture and blanket deposited on the field of the substrate of FIG. 4.

Referring now to FIG. 5, a cross-sectional diagram of a partially formed chemical vapor deposition aluminum layer being selectively deposited in the aperture 38 to form a void-free metal interconnect 44 and blanket deposited metal layer 46 on the field 33 is shown. Chemical vapor deposition of a metal on the structure 30 provides simultaneous selective deposition on the conductive floor 42 of the aperture 38 and blanket deposition on the nucleation layer 34 to provide conformal coverage of the structure 30 without forming voids in the interconnect or nodules on the field.

Figure 6:
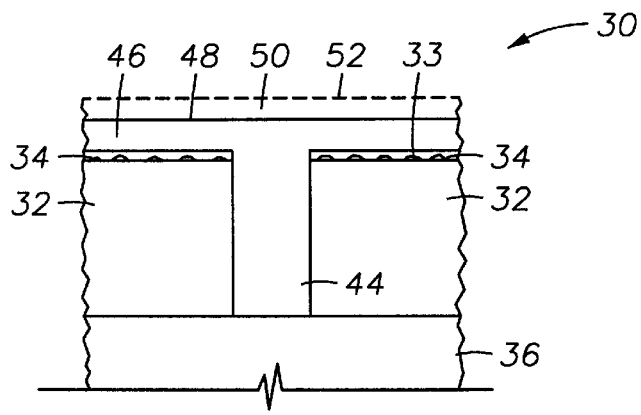
FIG. 6 is a cross-sectional diagram of the substrate of FIG. 5 having a complete CVD aluminum layer formed thereon.

Referring now to FIG. 6, a cross-sectional diagram of the substrate having an aluminum layer formed thereon via CVD is shown. A preferred implementation of the present invention will be described with reference to a PVD Ti self-aligning nucleation layer and a highly oriented CVD Al layer formed thereon. However, it should be understood that the present invention can be used to advantage to deposit any highly oriented conducting layer by PVD (such as PVD Al or Cu) or CVD (such as CVD Al or Cu). The uniform deposition of CVD Al over the self-aligning nucleation layer 34 provides a top surface 48 of the CVD Al which is substantially planarized. While the CVD Al may be deposited under various conditions, a typical process involves wafer temperatures of between about 180° C. and about 265° C. and a deposition rate of between about 20 Å/sec to about 130 Å/sec. The CVD Al process may be performed at chamber pressures of between about 1 torr and about 80 torr, with the preferred chamber pressure being about 25 torr. The preferred deposition reaction for CVD Al involves the reaction of dimethyl aluminum hydride ("DMAH") with hydrogen gas ($H_2$) according to the following equation:

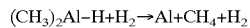

Material deposition within the aperture 38 (FIG. 4) to form metal interconnect 44 is selective because surface 42 of the underlying conductive or semiconductive layer 36 has been exposed to the CVD Al at the floor 42 of the aperture 38. Therefore, the CVD Al is deposited from the floor 42 upward to fill the aperture 38 without any substantial CVD Al deposition on the aperture walls 40.

Furthermore, where the nucleation layer 34 is deposited with a collimator located between the target and the substrate, the walls 40 of the aperture 38 receive little or no nucleation material, whereas the floor 42 of the aperture is formed by a conductive or semiconductive nucleation layer 36. As discussed above, substantially non-conducting dielectric materials are not good electron donors and, therefore, do not provide good nucleation sites for decomposition of the CVD conducting precursor. Rather, a metal film begins to form on the aperture floor 42 because the exposed conducting member 36 underlying the aperture 38 nucleates the decomposition. After an initial layer of the metal has been deposited on the aperture floor 42, subsequent deposition occurs more easily so that the metal grows from the via or contact floor 42 outward to fill the hole 38.

Although defects on the dielectric wall 40 of the aperture 38 may cause the formation of scattered nodules within the via or contact, these nodules will usually not block the via or contact and cause voids therein. Because the conducting aperture floor typically exposes a much greater surface area of a nucleation material than the defects, the via or contact will be filled with metal from the floor upward before a nodule has an opportunity to grow across the aperture and form a void therein, even in an aperture having an aspect ratio as high as 5:1.

In another aspect of the present invention, the substrate may be moved to a PVD Al chamber following the selective CVD process to deposit a PVD Al layer 50 over the CVD layer previously formed at temperatures below the melting point of the CVD Al and PVD Al. Where the CVD metal layer 46 is aluminum, it is preferred that the PVD Al layer 50 be deposited at a wafer temperature below about 660° C., preferably below about 400° C. The aluminum layer 46 will start to flow during the PVD deposition process at about 400° C., with the titanium nucleation layer 34 remaining firmly in place as a solid metal layer. Because titanium has good wetting with aluminum, CVD Al does not dewet from the titanium surface even at about 400° C. and, therefore, wafer temperatures above the melting point of aluminum (>660° C.), as taught by the prior art CVD process, are not required. As a result, the application of a thin titanium layer enables planarization of aluminum to be achieved at temperatures far below the melting point of aluminum, while enabling the creation of a highly oriented Al layer without the void forming process limits of CVD or PVD.

It is preferred that the PVD Al layer include at least trace amounts of copper (Cu). This can be accomplished by using an AlCu target to form the PVD AlCu layer. When the PVD AlCu sequentially follows CVD Al in an integrated process having a PVD and CVD chamber on the same cluster tool, an oxide layer cannot form therebetween and the PVD AlCu layer 50 grows epitaxially on the CVD Al layer 46 without grain boundaries, i.e., uniform crystal structure throughout both layers. Furthermore, the sequential CVD Al/PVD AlCu process allows the intermixed layer (elements 46 and 50 combined) to be annealed at about 300° C. for about 15 minutes to achieve substantially uniform distribution of Cu in the CVD/PVD layers. It is also preferred that the top surface 52 of the intermixed CVD/PVD Al layer receive a PVD TiN anti-reflection coating ("ARC") (not shown) for reducing the reflectivity of the surface and improving the photolithographic performance of the layer. A preferred method of the present invention for metallization of a substrate aperture includes the sequential steps of covering a conducting member 36 with a dielectric layer 32, etching vias or contacts 38 to expose a portion of the conducting member 36, depositing a self aligning, ultra-thin nucleation layer 34 of titanium through a coherent Ti process on the field, depositing selective/blanket CVD Al layer 44,46, depositing a PVD AlCu layer 50 and depositing a TiN ARC layer (not shown).

Figure 7:
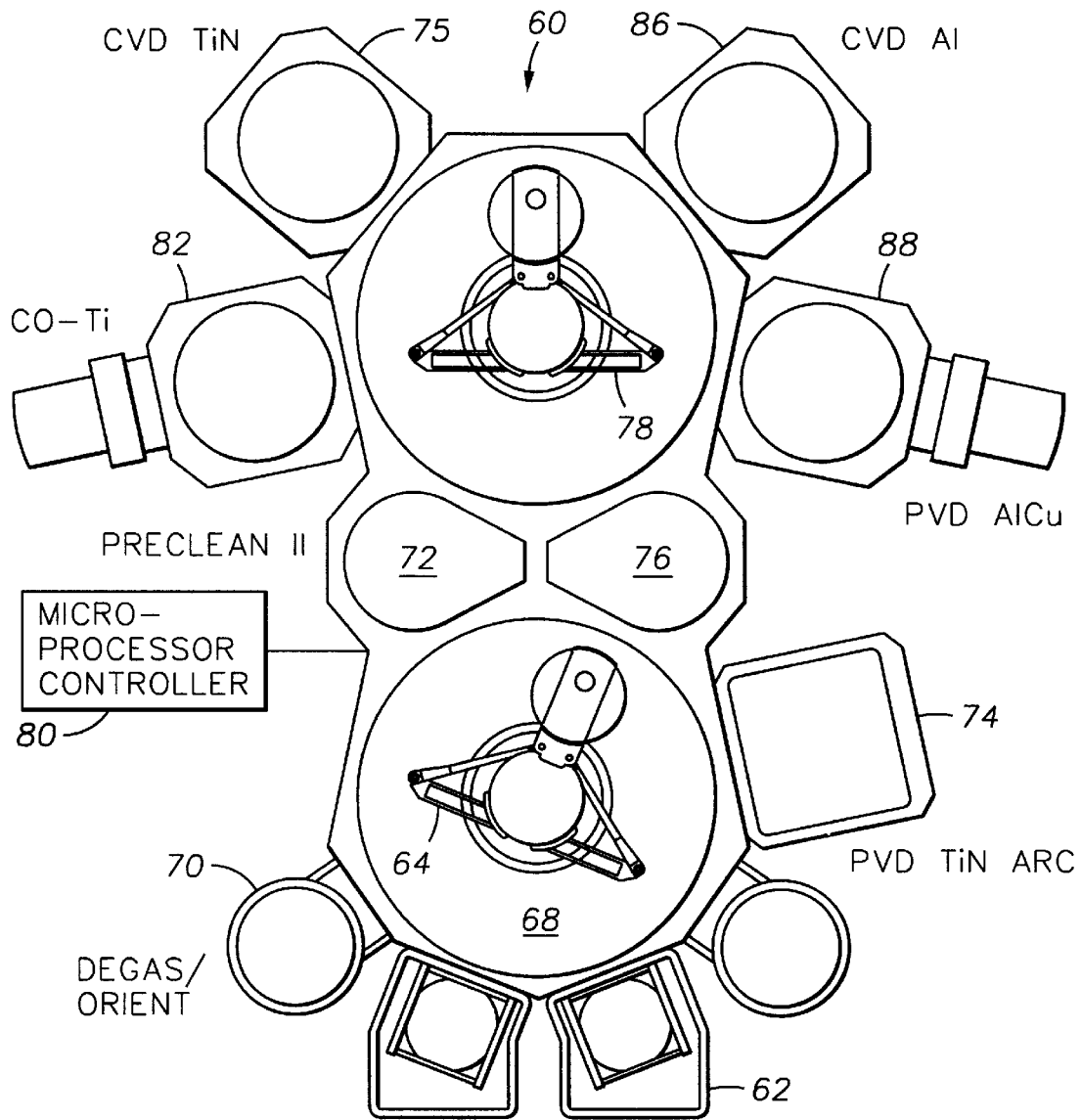
FIG. 7 is an integrated processing system configured for sequential metallization in accordance with the present invention.

Referring now to FIG. 7, a schematic diagram of an integrated cluster tool 60 having both PVD and CVD chambers thereon in which the above described processes can be implemented is shown. Typically, substrates are introduced and withdrawn from the cluster tool 60 through a cassette loadlock 62. A robot 64 having a blade 67 is located within the cluster tool 60 to move the substrates through the cluster tool 60. One robot 64 is typically positioned in a buffer chamber 68 to transfer substrates between the cassette loadlock 62, degas wafer orientation chamber 70, preclean chamber 72, PVD TiN ARC chamber 74 and cooldown chamber 76. A second robot 78 is located in transfer chamber 80 to transfer substrates to and from the cooldown chamber 76, coherent Ti chamber 82, CVD TiN chamber 84, CVD Al chamber 86 and PVD AlCu processing chamber 88. The transfer chamber 80 in the integrated system is preferably maintained at low pressure or high vacuum in the range of $10^{-3}$ to $10^{-8}$ torr. This specific configuration of the chambers in FIG. 6 comprise an integrated processing system capable of both CVD and PVD processes in a single cluster tool. This particular chamber configuration or arrangement is merely illustrative and more configurations of PVD and CVD processes are contemplated by the present invention.

Typically, a substrate processed in the cluster tool 60 is passed from the cassette loadlock 62 to the buffer chamber 68 where the robot 64 first moves the substrate into a degas chamber 70. The substrate is then transferred into preclean chamber 72, PVD TiN ARC chamber 74, and then into a cooldown chamber 76. From the cooldown chamber 76, the robot 78 typically moves the substrate into and between one or more processing chambers 32,31 before returning the substrate back to the cooldown chamber 76. It is anticipated that the substrate may be processed or cooled in one or more chambers any number of times in any order to accomplish fabrication of a desired structure on the substrate. The substrate is removed from the cluster tool 60, following processing, through the buffer chamber 68 and then to the loadlock 62. A microprocessor controller 80 is provided to control the sequence and formation of the desired film layers on the substrates.

In accordance with the present invention, the cluster tool 60 passes a substrate through loadlock 62 into de-gas chamber 70 wherein the substrate is introduced to outgas contaminants. A substrate is then moved into a pre-clean chamber 72 where the surface of the substrate is cleaned to remove any contaminants thereon. The robot 78 then transfers the substrate to either a Ti chamber 82, preferably having a collimator therein to deposit an ultra-thin nucleation layer on the substrate.

The substrate, with apertures extending through the dielectric layer down to the exposed conducting or semi-conducting layer surface defining the floor of the via or contact, then receives a layer of CVD metal, such as CVD Al, in a CVD Al chamber 86. The substrate may then be processed in a PVD AlCu chamber 88 and, optionally, in a PVD TiN ARC chamber 74 located on the integrated system.

One staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference. This system has been modified to accommodate a CVD chamber thereon.

Figure 8:
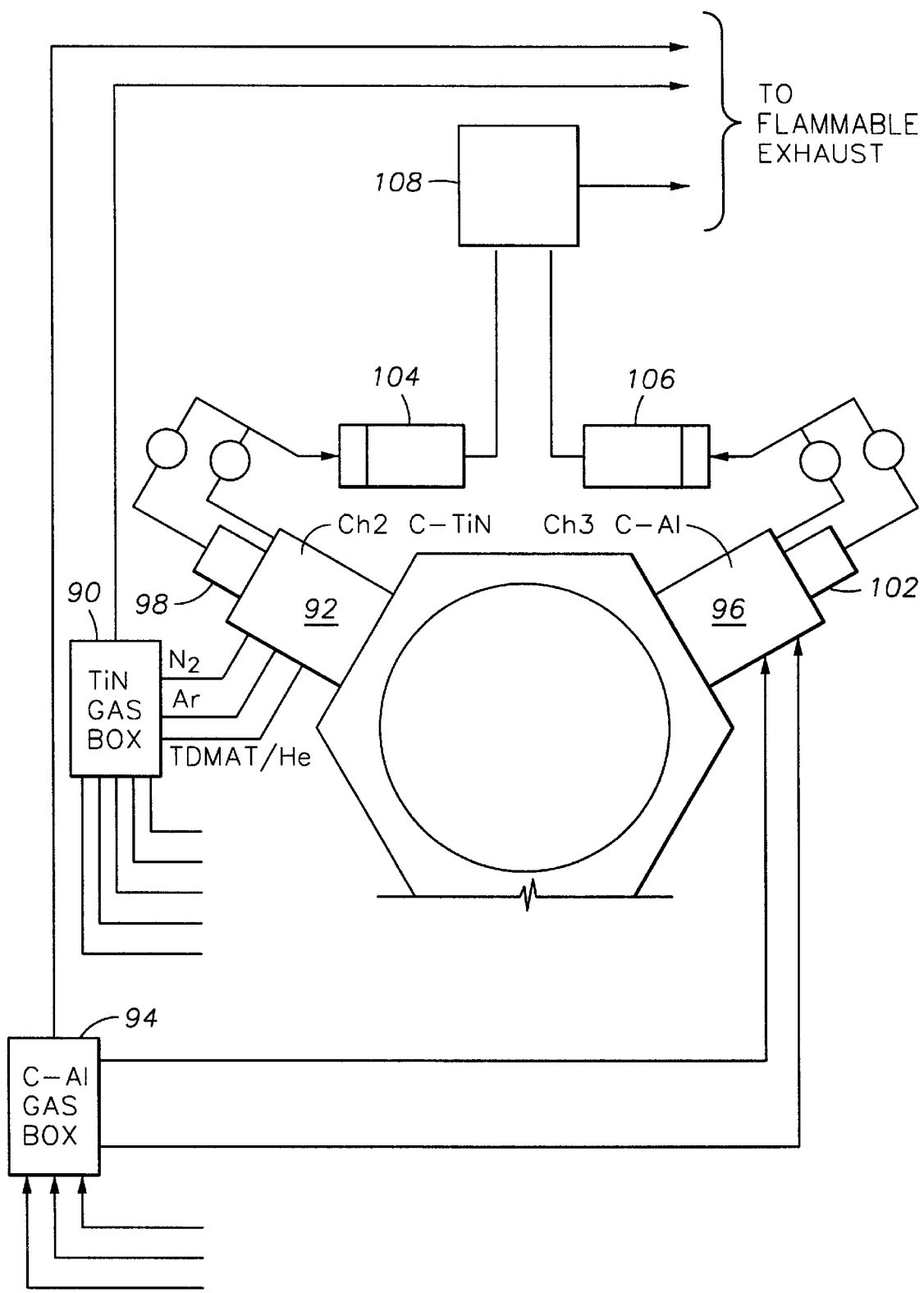
FIG. 8 is a schematic flow diagram of a CVD gas box delivery system for supplying gases to the system of FIG. 7.

Referring now to FIG. 8, a gas box system for supplying gases to the CVD chamber of the system in FIG. 6 is illustrated. The TiN gas box is supplied with $N_2$, Ar, He, $O_2$, and $NF_3$. The reaction product tetracus dimethyl amino titanium ("TDMAT"), along with the inert gas Ar and $N_2$, are passed into the CVD TiN chamber for processing. Similarly, a CVD Al gas box is supplied with $N_2$, Ar and $H_2$. The reaction product dimethyl aluminum hydride ("DMAH"), $H_2$ and the inert gas Ar are passed into the CVD Al chamber for deposition of aluminum. Both chambers are equipped with a turbo pump for providing a vacuum in the chamber and a blower/dry pump.

While the foregoing is directed to the preferred embodiment of the present invention, other and further embodiments of the invention may be devised without departing from the basic scope thereof. The scope of the invention is determined by the claims which follow.

We claim:

1. A method for forming an oriented film on a workpiece, comprising:

a) depositing a self-aligning epsilon layer of at least one deposition material on the workpiece, the epsilon layer having a thickness less than about 100 Å; and b) subsequently depositing a conducting material over the epsilon layer.

2. The method of claim 1, wherein the epsilon layer comprises one or more materials selected from the group consisting of Ti, TiN, Al, Nb, Ta, aluminum silicates, silica, high alumina, copper, and mixtures thereof.

3. The method of claim 2, further comprising the step of depositing a second epsilon layer over the first epsilon layer, wherein the second epsilon layer comprises one or more materials selected from the group consisting of Ti, TiN, Al, Nb, Ta, aluminum silicates, silica, high alumina, copper, and mixtures thereof.

4. The method of claim 1, wherein the conducting material comprises a material selected from the group consisting of aluminum, copper, and mixtures thereof.

5. The method of claim 4, wherein the conducting material is deposited by chemical vapor deposition.

6. The method of claim 5, wherein the epsilon layer comprises one or more materials selected from the group consisting of titanium, titanium nitride, aluminum, Nb, aluminum silicates, silica, high alumina, Si, Cu, Ta and mixtures thereof.

7. The method of claim 1, wherein the epsilon layer includes a plurality of materials selected from the group consisting of Ti, TiN, Cu and Al.

8. The method of claim 1, further comprising a barrier layer deposited over the substrate, and wherein the epsilon layer is deposited over the barrier layer.

9. The method of claim 8, wherein the conducting material is deposited by physical vapor deposition.

10. The method of claim 9, wherein the conducting material comprises a material selected from the group consisting of aluminum, copper, and mixtures thereof deposited by physical vapor deposition at a temperature above about 400° C.

11. The method of claim 10, wherein the conducting material further comprises a dopant, and wherein the method further comprises annealing the workpiece at a temperature between about 250° C. and about 350° C. after the conducting material has been deposited.

12. The method of claim 1, wherein the method is carried out in an integrated processing system.

13. The method of claim 1 wherein the epsilon layer comprises a sub-monolayer of atoms of one or more materials selected from the group consisting of Ti, TiN, Al, Cu, Nb, Ta, aluminum silicates, silica, high alumina, and mixtures thereof.

14. A method for improving reflectivity of a film layer formed on a substrate, comprising:

a) providing a conformal film layer over the substrate; then b) sputtering a self-aligning epsilon material having a thickness less than about 100 Å on the conformal layer; and then c) depositing a conductor over the epsilon material to form the film.

15. The method of claim 14 wherein the conformal film comprises a barrier material.

16. The method of claim 15 wherein the epsilon material comprises one or more materials selected from the group consisting of Ti, TiN, Al, Cu, Nb, Ta, aluminum silicates, silica, high alumina, and mixtures thereof.

17. The method of claim 16 wherein the conductor comprises a material selected from the group consisting of aluminum, copper, and mixtures thereof deposited by chemical vapor deposition.

18. The method of claim 16 wherein the epsilon material comprises a sub-monolayer of epsilon material atoms.

* * * * *